United States Patent
Huang et al.

(10) Patent No.: US 6,884,714 B2
(45) Date of Patent: Apr. 26, 2005

(54) METHOD OF FORMING SHALLOW TRENCH ISOLATION WITH CHAMFERED CORNERS

(75) Inventors: Tse-Yao Huang, Taipei (TW); Yi-Nan Chen, Taipei (TW); Chung-Peng Hao, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/612,859

(22) Filed: Jul. 3, 2003

(65) Prior Publication Data

US 2004/0198038 A1 Oct. 7, 2004

(30) Foreign Application Priority Data

Apr. 7, 2003 (TW) .......................................... 92107876 A

(51) Int. Cl.$^7$ .......................................... H01L 21/4763
(52) U.S. Cl. ...................... 438/637; 438/400; 438/296
(58) Field of Search .................................. 438/400, 424

(56) References Cited

U.S. PATENT DOCUMENTS 5,933,749 A    8/1999  Lee
6,258,692 B1 * 7/2001  Chu et al. .................... 438/400
6,323,092 B1 * 11/2001 Lee ............................. 438/296

FOREIGN PATENT DOCUMENTS

TW        459339      10/2001
TW        4609074     10/2001

* cited by examiner

Primary Examiner—David Nelms
Assistant Examiner—Thao P. Le
(74) Attorney, Agent, or Firm—Quintero Law Office

(57) ABSTRACT

A method of forming shallow trench isolation with chamfered corners. First, a pad insulating layer, a first mask layer, and a second mask layer are sequentially formed on a substrate. The second mask layer, the first mask layer, and the pad insulating layer are patterned to form an opening exposing a portion of the substrate. Next, the substrate is etched using the patterned second mask layer as a mask to form a trench therein. Next, part of the second mask layer is removed to expose the first mask layer adjacent to the trench and result in the second mask layer having a tapered profile. Finally, the second mask layer, the first mask layer, the pad insulating layer, and the substrate are etched along the tapered profile of the second mask layer to chamfer corners of the trench.

24 Claims, 8 Drawing Sheets

METHOD OF FORMING SHALLOW TRENCH ISOLATION WITH CHAMFERED CORNERS

BACKGROUND OF THE INVENTION

1. Field of the Invention

The invention relates to a process of forming shallow trench isolation. More particularly, the present invention relates to a manufacturing method of forming shallow trench isolation with chamfered corners.

2. Description of the Related Art

Recently, as the manufacturing techniques of semiconductor integrated circuits develop, the number of devices in a chip has increased. The size of the device also decreases as the degree of integration increases. The line width used in manufacturing, lines has decreased from sub-micron to quarter-micron, or even smaller. Regardless of the reduction of the size of the device, adequate insulation or isolation must be provided among individual devices in the chip so that good element characteristics can be achieved. This technique is called device isolation technology. The main object is to form an isolation region, reducing the size of the isolation as much as possible while assuring good isolation effect to allow larger chip space for more devices.

Among different device isolation techniques, LOCOS and shallow trench isolation region manufacturing methods are the two most used methods. In particular, as the latter has a small isolation region and can keep the substrate level after the process is finished, it is the semiconductor manufacturing method obtaining the most attention.

The conventional manufacturing method for a shallow trench isolation region comprises forming a dielectric layer to fill a trench on a substrate by chemical vapor deposition (CVD), and etching back the dielectric layer on the substrate to remove the redundant dielectric layer. However, as the density of the semiconductor integrated circuits increases and the size of the elements decreases, the above mentioned deposition experiences problems in step coverage and cannot completely fill the trench. This influences the isolation effect among elements.

As a result of filling the entire trench which has a high aspect ratio, recently, high-density plasma chemical vapor deposition (HDPCVD) is used to form a dielectric layer on the substrate instead of CVD. In HDPCVD, the dielectric layer is deposited using $O_2$ and $SiH_4$ gases.

FIGS. 1A–1C show a conventional fabrication process of a shallow trench isolation. In FIG. 1A, a pad oxide layer 12 is deposited on a substrate 10 such as Si substrate, wherein the thickness of the pad oxide layer 12 is about 50–200 Å. The pad oxide layer 12 is formed using thermal oxidation or CVD. Thereafter, a silicon nitride layer 14 is deposited on the pad oxide layer 12 using CVD, and the thickness of the silicon oxide layer 14 is 500–2000 Å. A mask layer thereby consists of the pad oxide layer 12 and the silicon nitride layer 14. Next, a patterned photoresist layer 13 is defined on the silicon nitride layer 14 and the pad oxide layer 12 using photolithography and etching techniques to expose a portion of the substrate 10 where the shallow trench isolation is formed.

Next. In FIG. 1B, the exposed portion of the substrate 10 is etched using the silicon nitride layer 14 and the pad oxide layer 12 as a mask to form a trench 15, and the depth of the trench 15 is about 3500–5000 Å. Then, a thin liner layer 16 is formed on the sidewall of the trench 15 using thermal oxidation process, and the thickness of the liner layer 16D is 180 Å.

As shown in FIG. 1C, in HDPCVD, a dielectric layer 18 is deposited and fills the trench 15, wherein $O_2$ and $SiH_4$ are reactants.

As shown in FIG. 2, due to the opening of the trench narrowing and/or the aspect ratio of the trench increasing, for example the opening width may be less than 0.11 μm and/or the aspect ratio larger than 4, the dielectric layer 18 deposited on the silicon nitride layer 14 may cover the opening of the trench 15 in the HDPCVD process, such that the dielectric layer 18 cannot fill the trench 15 completely and a void 20 is formed in the trench, resulting in poor insulation quality of the shallow trench isolation region.

Because the properties of the dielectric layer 18 are similar to those of the pad oxide layer 12, when etchant is used to dip pad oxide layer 12, the shallow trench isolation region 28 is inevitably etched so that the corner 22 of the trench 15 is exposed and an indentation 30 is formed adjacent to the corner 22 of the trench 15.

Thus, when the gate oxide layer and gate conductive layer are formed later, the conductive layer deposited in the indentation 30 is not easily removed and a short circuit between the adjacent transistors easily occurs. In addition, since the gate oxide layer at the corner 22 of the the trench 15 is thinner than other places, a parasitic transistor is formed. When current goes through this parasitic transistor, as the curvature radius of the corner 22 of the trench 15 is small, the electric fields concentrate and the Fowler-Nordheim current increases, hence the insulating property of the gate oxide layer of the corner 22 degrades, resulting in abnormal element characteristics. For example, there may be a kink effect in I-V curvature of Id and Vg, which generates a double hump.

SUMMARY OF THE INVENTION

Accordingly, an object of the present invention is to provide a method of forming shallow trench isolation with chamfered corners to promote isolation among elements and avoid voids by increasing the gap-filling ability of the shallow trench isolation with improved corner configuration when the dielectric layer is filled thereinto.

Moreover, the present invention provides a manufacturing method, which avoids forming a trench isolation region of parasitic transistors at the corner of the trench.

Furthermore, the present invention provides a manufacturing method of forming a trench isolation region, which avoids short circuit between adjacent transistors.

To achieve the above mentioned objects, the method of forming shallow trench, isolation with chamfered corners according to the present invention includes the following steps. First, a pad insulating layer, a first mask layer, and a second mask layer are sequentially formed on a substrate. The second mask layer, the first mask layer, and the pad insulating layer are patterned to form an opening exposing a portion of the substrate. Next, the substrate is etched using the patterned second mask layer as a mask to form a trench therein. Next, part of the second mask layer is removed to expose the first mask layer adjacent to the trench and result in the second mask layer having a tapered profile. Finally, the second mask layer, the first mask layer, the pad insulating layer, and the substrate are etched along the tapered profile of the second mask layer to chamfer corners of the trench.

One aspect of the invention, before the insulator layer is formed, further comprises forming a shield layer on the surface of the substrate, the trench, and the chamfered corners.

In the present invention, after chamfering the corners of the trench, the method of forming shallow trench isolation with chamfered corners according to the present invention further comprises the following steps. The second mask layer is completely removed. The first mask layer and the pad insulating layer are etched to remove a predetermined width thereof to expose a portion of the substrate adjacent to the trench. An insulator layer is blanketly formed on the exposed surface of the substrate and the chamfered corners thereof to fill the trench. The first mask layer and the pad insulating layer are removed to form the trench isolation region.

Another aspect of the invention, before the insulator layer is formed, further comprises forming a lining oxide layer on the surface of the substrate, the trench, and the chamfered corners.

The present invention also provides another method of forming shallow trench isolation with chamfered corners, including the following steps. First, a pad insulating layer, a first mask layer, and a second mask layer are sequentially formed on a semiconductor substrate. Then, the second mask layer, the first mask layer, and the pad insulating layer are patterned to form an opening exposing a portion of the semiconductor substrate. Next, the semiconductor substrate is etched using the patterned second mask layer as a mask to form a trench therein. Next, part of the second mask layer is removed to expose the first mask layer adjacent to the trench and result in the second mask layer having a tapered profile. Next, the second mask layer, the first mask layer, the pad insulating layer, and the substrate are etched along the tapered profile of the second mask layer to chamfer corners of the trench. Furthermore, the second mask layer is completely removed. A shield layer is formed on the surface of the substrate, the trench, and the chamfered corners. An insulator layer is blanketly formed on the shield layer to fill the trench. Finally, the first mask layer and the pad insulating layer are removed to form the trench isolation region.

According to another aspect of the invention, the method of the present invention further comprises, after removing the second mask layer, etching the first mask layer and the pad insulating layer to remove a predetermined width thereof and expose a portion of the semiconductor substrate adjacent to the trench.

A detailed description is given in the following embodiments with reference to the accompanying drawings.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

FIGS. 4A to 4J are cross sections of the manufacturing process of a shallow trench isolation region with chamfered corners in accordance with the present invention.

Figures 1A, 1B:
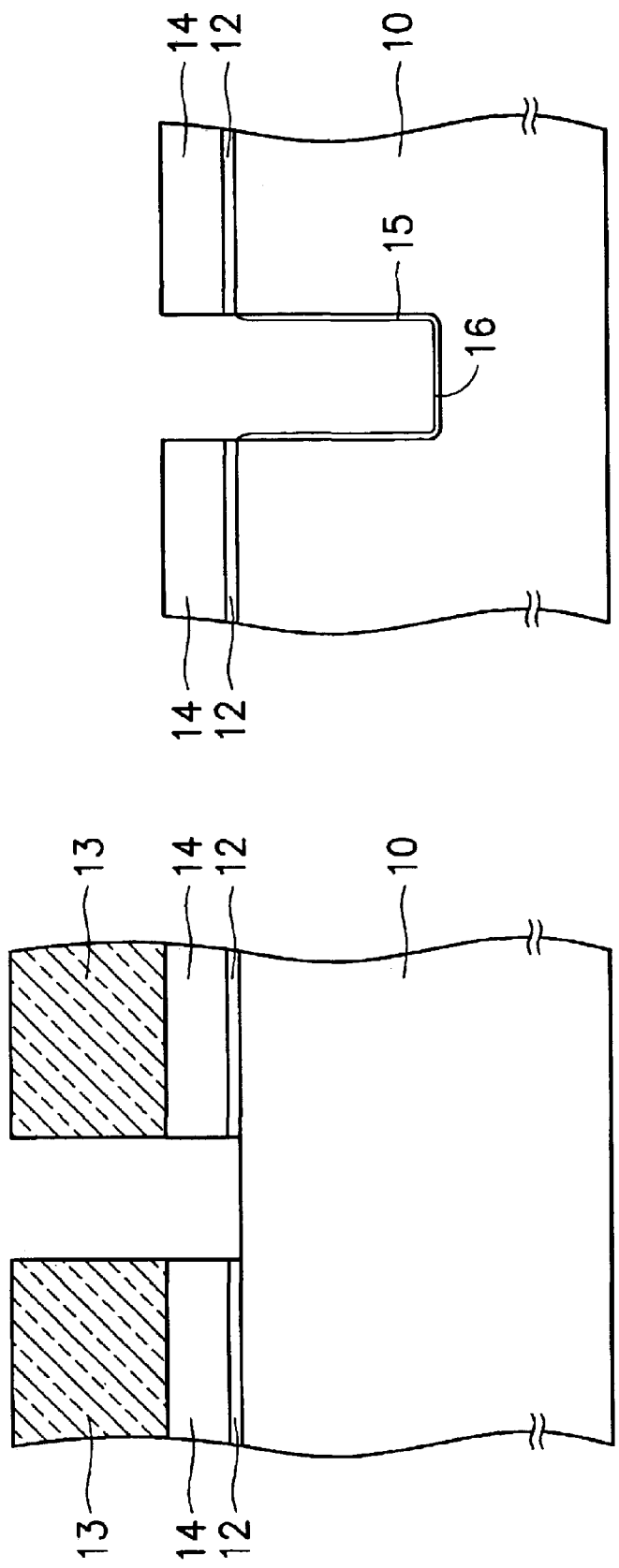
FIGS. 1A to 1C show cross sections of the manufacturing process of the conventional shallow trench isolation region.
Figure 1C:
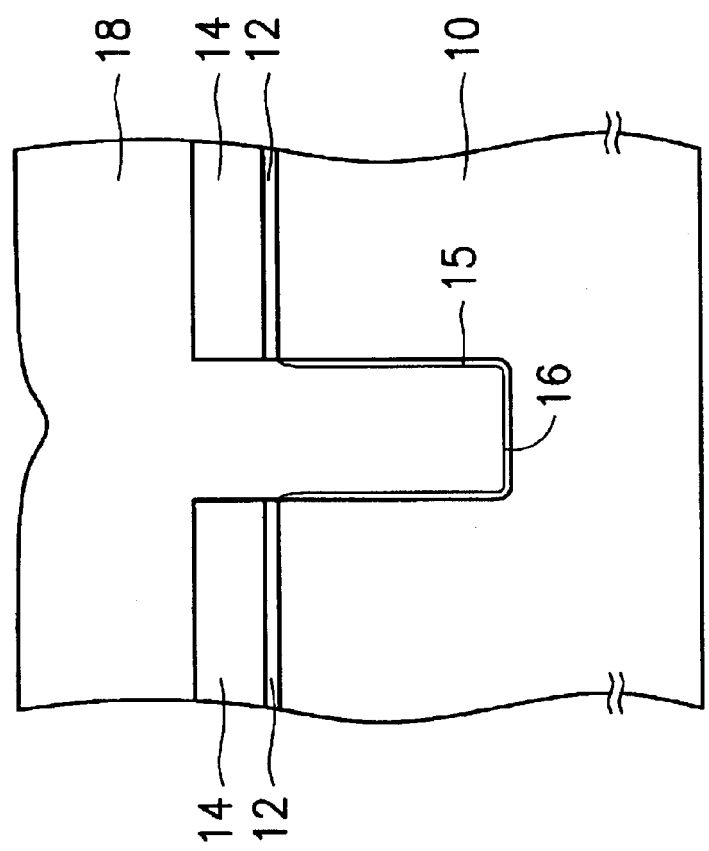
Figure 3:
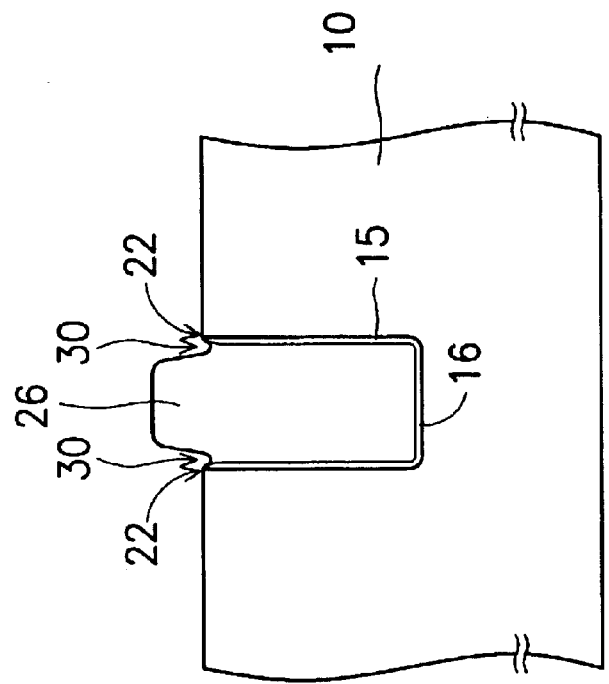
FIG. 3 is a schematic diagram showing the indentations formed by etching in the conventional manufacturing process of the shallow trench isolation region.
Figure 2:
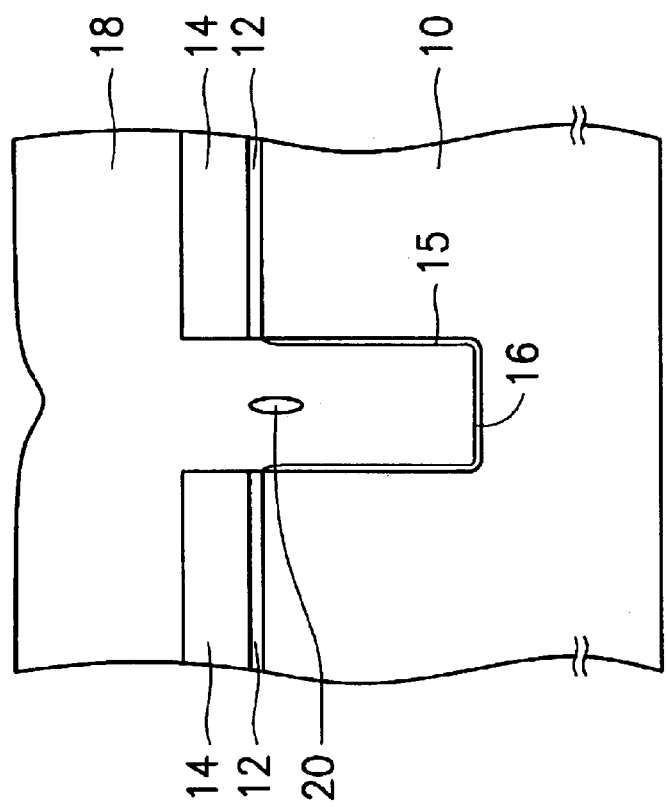
FIG. 2 is a schematic diagram showing voids formed by filling the conventional shallow trench isolation region using HDPCVD.
Figures 4A, 4B:
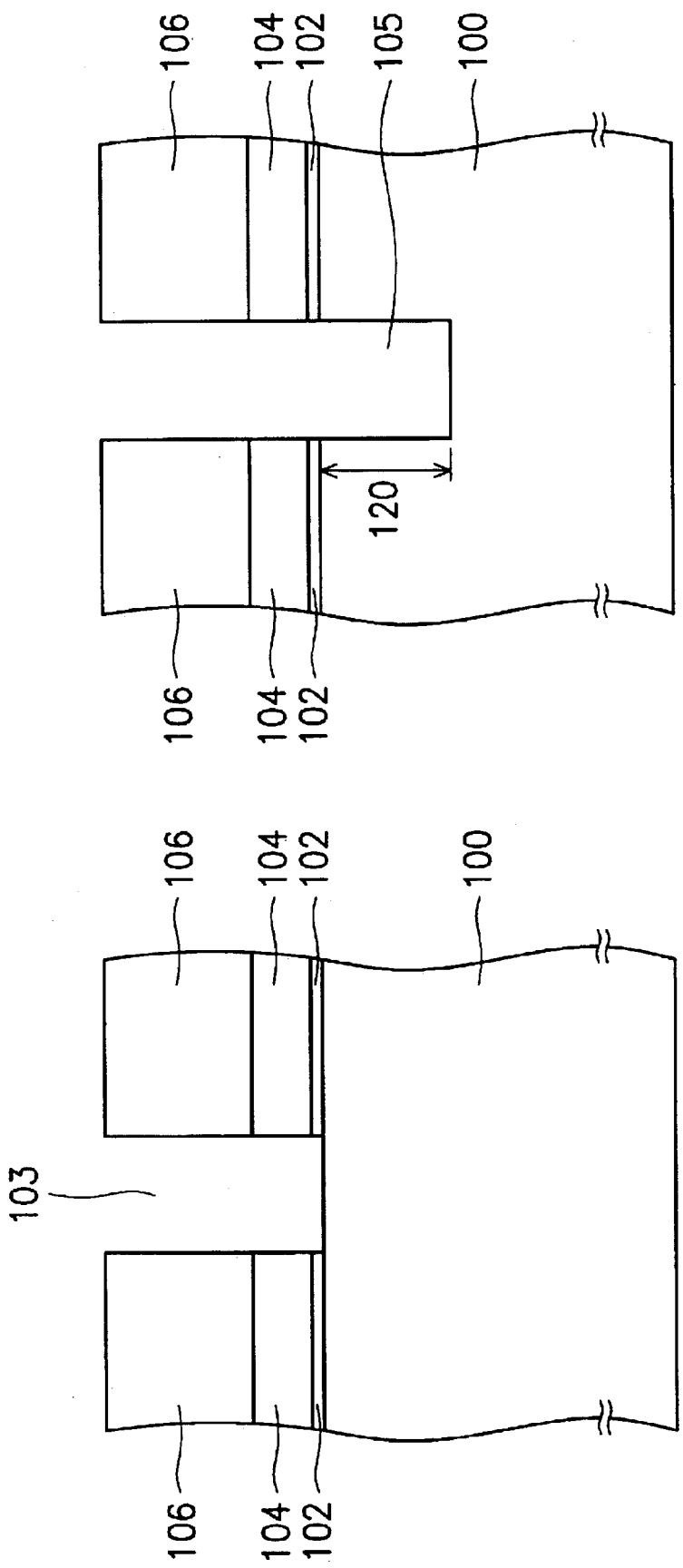
FIGS. 4A to 4J are cross sections illustrating the manufacturing process of a shallow trench isolation region with chamfered corners in accordance with the present invention.

First, referring to FIG. 4A, a semiconductor substrate 100, for example silicon substrate, is provided. Herein, use of the term substrate includes devices formed within a semiconductor wafer and the layers overlying the wafer. Next, a pad insulation layer 102, a first mask layer 104 and a second mask layer 106 are formed sequentially on the surface of the semiconductor substrate 100. Preferably, the pad insulation layer 102 such as pad oxide layer with a thickness of 50 Å to 200 Å is formed using thermal oxidation at 850–950° C., APCVD, or LPCVD. The first mask layer 104 such as silicon nitride with a thickness of 5000 Å to 2000 Å is formed using LPCVD at 750–800° C., wherein $SiCl_2H_2$ and $NH_3$ are reactants. As well, the first mask layer 104 may also be silicon oxy-nitride formed by LPCVD, wherein $SiH_4$, $N_2O$, and $NH_3$ are reactants.

Suitable material for the second mask layer 106 is silicide such as boro phosphor silicate glass (BPSG), phosphor silicate glass (PSG), boro silicate glass (BSG), and arsenic silicate glass (AsSG). Preferably, the second mask layer 106, of BSG with a thickness of 1000 Å to 4000 Å is formed by LPCVD, wherein $SiH_4$, $BF_3$, and $B_2H_6$ are reactants.

Subsequently, a patterned photoresist (PR) layer (not shown in FIG. 4A) is coated on the surface of the second mask layer 106, and photolithography performed to define the photoresist pattern required. Moreover, the second mask layer 108, the first mask layer 104, and the pad insulating layer 102 are etched anisotropically (for example reactive ion etching), with the patterned photoresist acting as a mask.

Furthermore, the patterned photoresist layer is used as a mask to anisotropically etch the second mask layer 106, the first mask layer 104, and the pad insulating layer 102, for example reactant ion etching, to transfer the pattern of the photoresist layer to the second mask layer 106, the first mask layer 104, and the pad insulating layer 102 to form opening 103, such-that the semiconductor substrate 100 in the opening 103 is exposed, and the size of the opening 103 is substantially that of the isolation region. Then, suitable solution or dry etching is performed to remove the photoresist layer.

Subsequently, referring to FIG. 4B, the patterned second mask layer 106 is used as a mask to anisotropically etch semiconductor substrate 100, for example reactant ion etching, and a trench 105 with a depth 120 of 1800 Å to 2400 Å is formed.

Figure 4D:
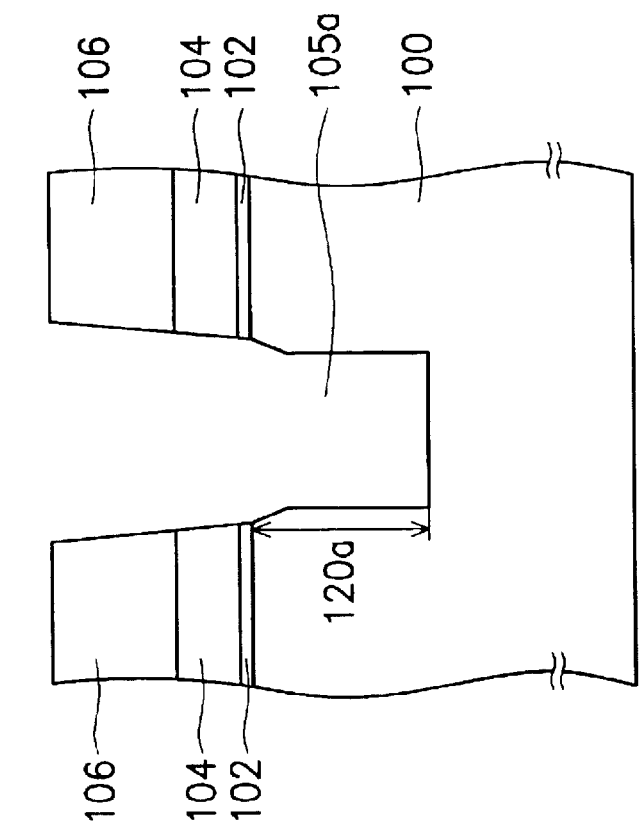
Figure 4C:
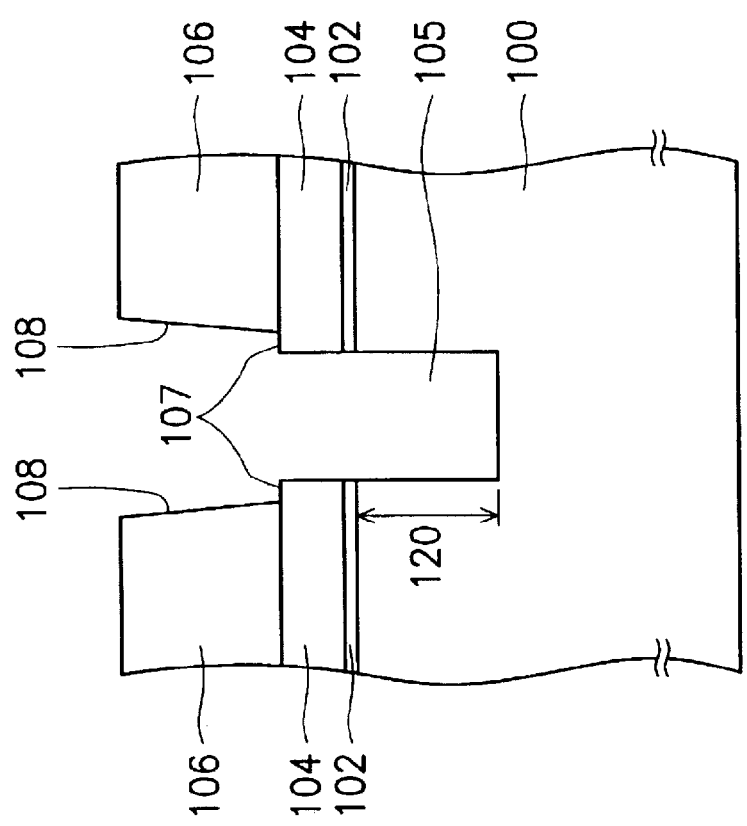

Subsequently, referring to FIG. 4C, a wet treatment is then performed. The wet treatment includes using etchant, such as a solution of ammonium hydrogen peroxide mixture (APM), to etch both sides of the second mask layer 106 adjacent to the opening 103. After etching, part of the second mask layer 106 adjacent to the opening 103 with a width between 150–250 Å is removed and the second mask layer 106 with tapered profiles 108 adjacent to the opening 103 is formed. Preferably, the ratio of $NH_4OH:H_2O_2$:deionized water (DIW) is about 1:1:5 and the etching temperature is 60° C. or higher.

Subsequently, referring to FIG. 4D, anisotropic etching, for example RIE, is performed along the tapered profiles 108 of the second mask layer 106 to remove part of the second mask layer 106, the first mask layer 104, the pad insulating layer 102, and the semiconductor substrate 100 around the trenches 105. Then, the corners of the trench 105 are chamfered, and Y-shaped trench 105a is further formed. The depth 120a (for example, between 2700–3800 Å) of the Y-shaped trench 105a is deeper than that of the original trench 105, and the aspect ratio of the Y-shaped trench is between 4–6.

Figures 4E, 4F:
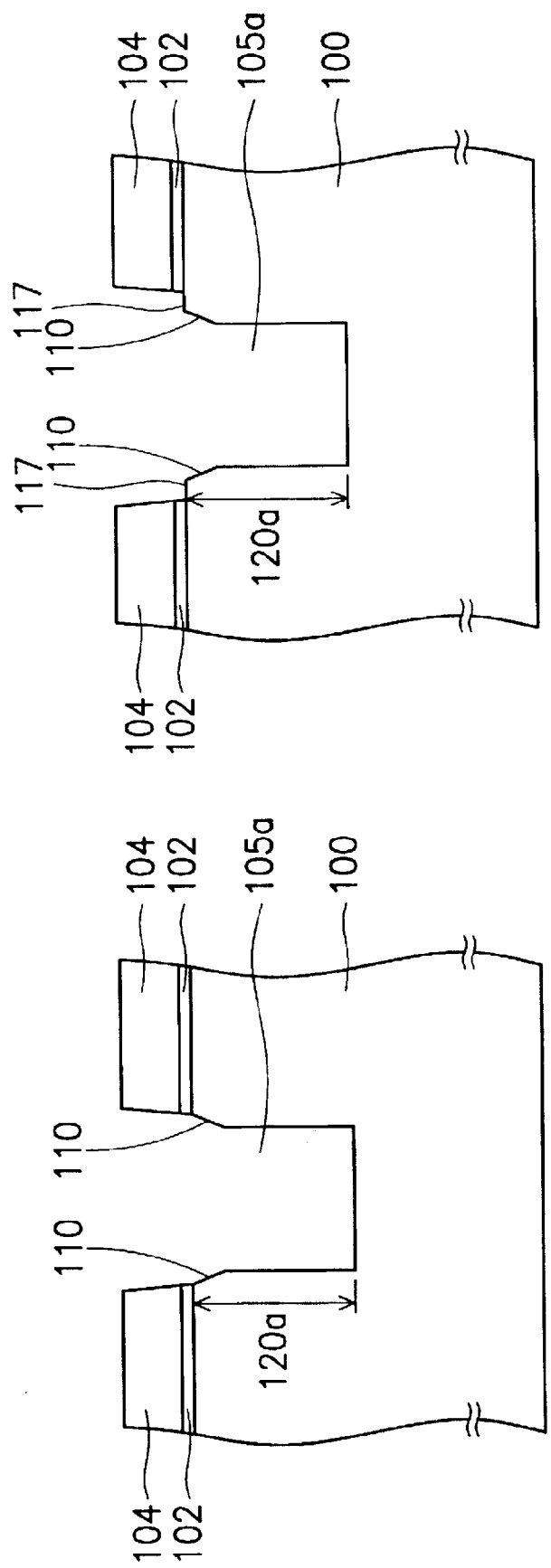

Subsequently, referring to FIG. 4E, the second mask layer 106 is completely removed by appropriate etching, for example, wet treatment with buffered hydrofluoric acid as etchant to etch the second mask layer 106 composed of BSG. Next, wet treatment etches both sides of the first mask layer-104 and the pad insulating layer 102 adjacent to the trench 105a until a width between 50–300 Å thereof is removed, as shown in FIG. 4F. Preferably, a hydrofluoric acid/ethylene glycol mix (HF/EG) etches the first mask layer 104 and the pad insulating layer 102.

Figure 4H:
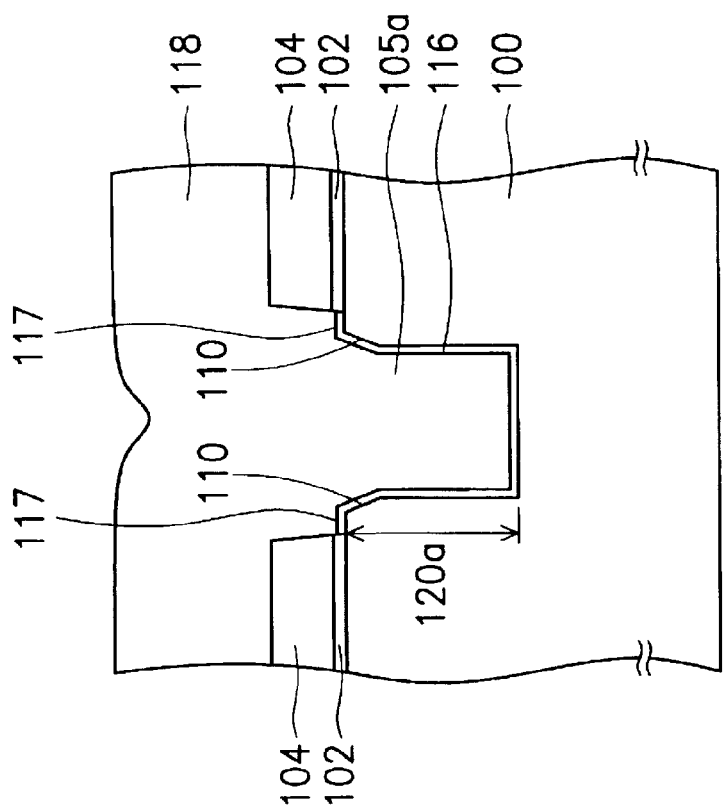
Figure 4G:
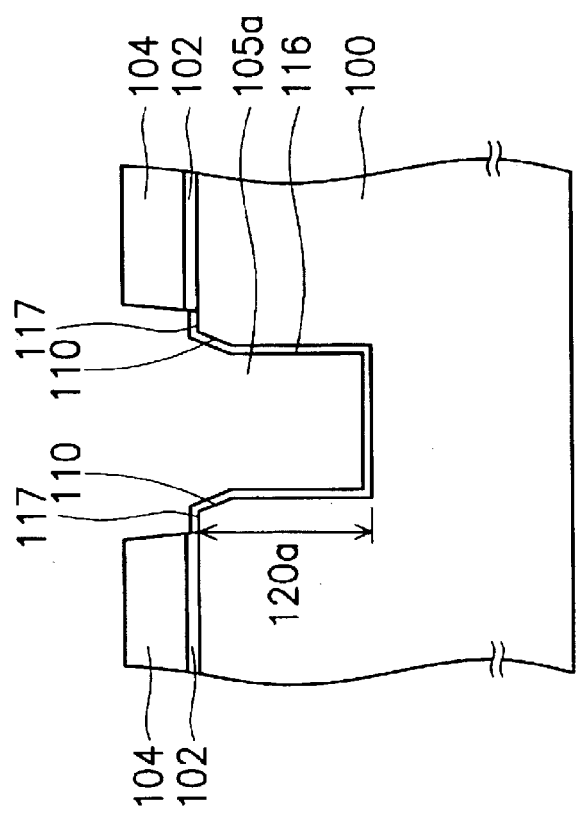

Subsequently, referring to FIG. 4G, a thermal oxidation process is performed to grow a shield layer 116 such as a liner oxide layer with a thickness of 50 Å to 350 Å in the bottom, sidewall, and chamfered corners of the trench 105a and the surface 117 of the substrate 100.

Figure 4J:
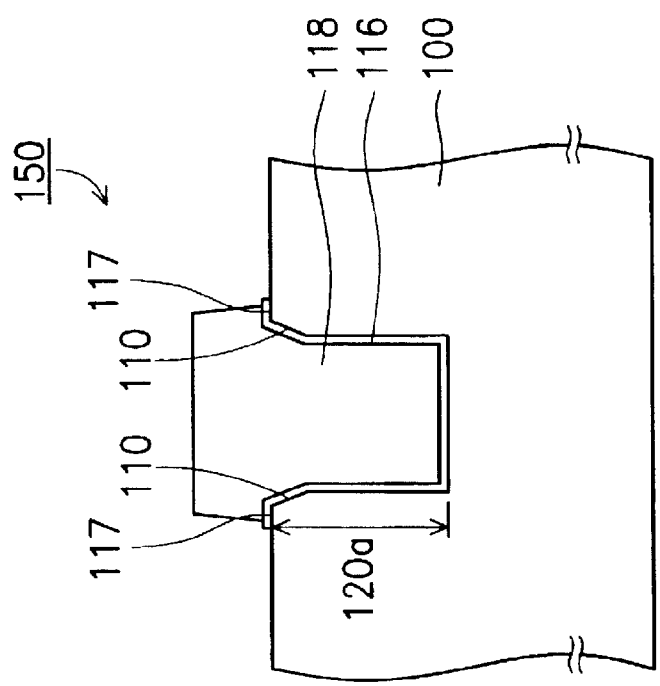
Figure 4I:
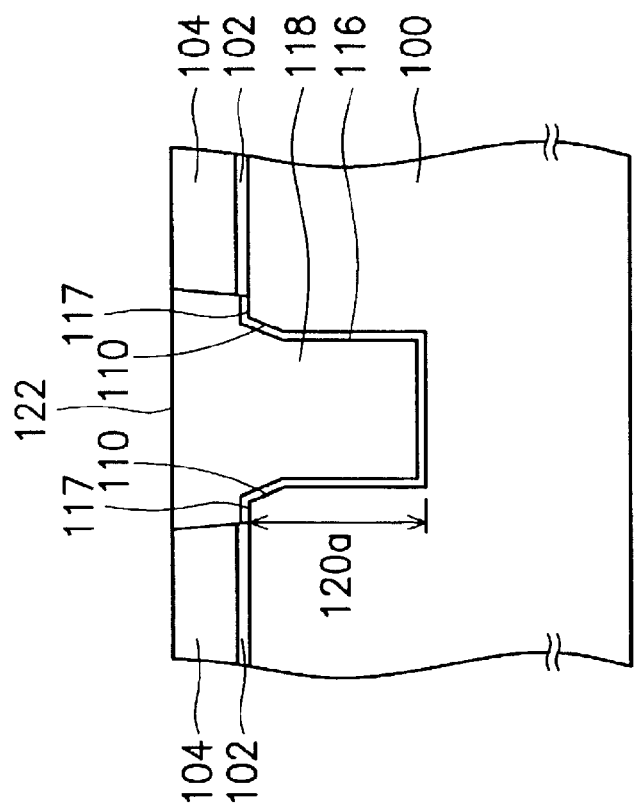

Subsequently, referring to FIG. 4H, an insulator layer 118, such as a silicon dioxide layer, with a thickness of 3000–5000 Å is formed on the shield layer 116 by HDPCVD using $O_2$ and $SiH_4$ as reactants with Ar sputtering. Finally, referring to FIG. 4I, chemical mechanical polishing removes uneven insulator layer 118 to cover the shield layer 116 and leave the insulator layer 118 inside the trench 105a. The fist mask layer 104 and the pad insulating layer 102 are then removed using adequate liquid or etching to expose the element region, as shown in FIG. 4J. Accordingly, the shallow trench isolation region 150 of the present invention is achieved. Preferably, the fat mask layer 104 is removed by, for example, a hot phosphoric acid solution and the pad insulating layer 102 is removed by, for example, a HF solution.

Compared to the prior art, the manufacturing method of forming shallow trench isolation with chamfered corners in the present invention has several advantages.

First, the present invention prevents void in the high aspect ratio shallow trench isolation region to promote the insulation quality thereof. Particularly, the method according the present invention can be used to fill the trench having aspect ratio exceeding 6 with insulator layer by HDPCVD.

Second, the corners of the trench in the present invention are already chamfered and thickness of the shield layer subsequently formed in this region is the same as in the other regions, thus no parasitic transistors will form and problems with the parasitic transistors will not occur, so the method in the present invention avoids short circuit between adjacent transistors.

Since the corner of the trench of the present invention is already chamfered, the conductive material subsequently formed in this region has no space blockage and is easily removed, thus preventing short circuit between the adjacent transistors. Therefore, the shallow trench isolation region of the invention has good electrical insulation.

While the invention has been described by way of example and in terms of the preferred embodiments, it is to be understood that the invention is not limited to the disclosed embodiments. To the contrary, it is intended to cover various modifications and similar arrangements. (as would be apparent to those skilled in the art). Therefore, the scope of the appended claims should be accorded the broadest interpretation so as to encompass all such modifications and similar arrangements.

What is claimed is:

1. A method of forming shallow trench isolation with chamfered corners, comprising:

forming a pad insulating layer, a first mask layer, and a second mask layer on a substrate;

patterning the second mask layer, the first mask layer, and the pad insulating layer to form an opening exposing a portion of the substrate;

etching the substrate using the patterned second mask layer as a mask to form a trench in the substrate;

removing part of the second mask layer to expose the first mask layer adjacent to the trench and result in the second mask layer having a tapered profile; and etching the second mask layer, the first mask layer, the pad insulating layer, and the substrate along the tapered profile of the second mask layer to chamfer corners of the trench.

2. The method of forming shallow trench isolation with chamfered corners of claim 1, wherein the pad insulating layer is silicon dioxide.

3. The method of forming shallow trench isolation with chamfered corners of claim 1, wherein the first mask layer is silicon nitride.

4. The method of forming shallow trench isolation with chamfered corners of claim 1, wherein the second mask layer is a layer of boro phosphor silicate glass (BPSG), phosphor silicate glass (PSG), boro silicate glass (BSG), or arsenic silicate glass (AsSG).

5. The method of forming shallow trench isolation with chamfered corners of claim 1, wherein the method used for removing part of the second mask layer to expose the first mask layer adjacent to the trench is wet etching.

6. The method of forming shallow trench isolation with chamfered corners of claim 5, wherein the wet etching uses a solution of ammonium hydrogen peroxide mixture (APM).

7. The method of forming shallow trench isolation with chamfered corners of claim 1, further comprising, after chamfering the corners of the trench, steps of:

completely removing the second mask layer;

etching the first mask layer and the pad insulating layer to remove a predetermined width thereof to expose a portion of the substrate adjacent to the trench;

blanketly forming an insulator layer on the exposed surface of the substrate and the chamfered corners thereof to fill the trench; and flattening the insulator layer, and removing the first mask layer and the pad insulating layer to form a trench isolation region.

8. The method of forming shallow trench isolation with chamfered corners of claim 7, wherein the trench of the trench isolation region has a Y-shaped cross-section.

9. The method of forming shallow trench isolation with chamfered corners of claim 7, wherein etching of the first mask layer and the pad insulating layer to remove a predetermined width thereof to expose a portion of the substrate adjacent to the trench uses wet etching.

10. The method of forming shallow trench isolation with chamfered corners of claim 9, wherein the wet etching uses a solution of hydrofluoric acid/ethylene glycol mix (HF/EG).

11. The method of forming shallow trench isolation with chamfered corners of claim 7, wherein blanketly forming the insulator layer to fill the trench uses high-density plasma chemical vapor deposition (HDPCVD) or low pressure chemical vapor deposition (LPCVD).

12. The method of forming shallow trench isolation with chamfered corners of claim 7, further comprising, before forming the insulator layer, forming a shield layer on the surface of the substrate, the trench, and the chamfered corners.

13. The method of forming shallow trench isolation with chamfered corners of claim 12, wherein the shield layer is a liner oxide layer formed by thermal oxidation.

14. A method of forming shallow trench isolation with chamfered corners, comprising:

forming a pad oxide layer, a first mask layer, and a second mask layer on a substrate;

patterning the second mask layer, the first mask layer, and the pad oxide layer to form an opening exposing a portion of the substrate;

etching the substrate using the patterned second mask layer as a mask to form a trench in the substrate;

removing part of the second mask layer by wet etching to expose the first mask layer adjacent to the trench and result in the second mask layer having a tapered profile;

etching the second mask layer, the first mask layer, the pad insulating layer, and the substrate along the tapered profile of the second mask layer to chamfer corners of the trench;

completely removing the second mask layer;

forming a liner oxide layer on the surface of the substrate, the trench, and the chamfered corners, blanketly forming an insulator layer on the exposed surface of the substrate and the chamfered corners thereof to fill the trench; and flattening the insulator layer, and removing the first mask layer and the pad oxide layer to form a trench isolation region.

15. The method of forming shallow trench isolation with chamfered corners of claim 14, wherein the insulator layer is flattened by CMP.

16. The method of forming shallow trench isolation with chamfered corners of claim 14, wherein the first mask layer is silicon nitride.

17. The method of forming shallow trench isolation with chamfered corners of claim 14, wherein the second mask layer is a layer of BPSG, PSG, BSG, or AsSG.

18. The method of forming shallow trench isolation with chamfered corners of claim 14, wherein the wet etching uses a solution of APM.

19. The method of forming shallow trench isolation with chamfered corners of claim 14, wherein the trench of the trench isolation region has a Y-shaped cross-section.

20. The method of forming shallow trench isolation with chamfered corners of claim 14, wherein blanketly forming the insulator layer to fill the trench uses HDPCVD or LPCVD.

21. The method of forming shallow trench isolation with chamfered corners of claim 14, wherein the liner oxide layer is formed by thermal oxidation.

22. The method of forming shallow trench isolation with chamfered corners of claim 14, further comprising, after removing the second mask layer, etching the first mask layer and the pad oxide layer to remove a predetermined width thereof to expose a portion of the substrate adjacent to the trench.

23. The method of forming shallow trench isolation with chamfered corners of claim 22, wherein etching of the first mask layer and the pad oxide layer uses wet etching.

24. The method of forming shallow trench isolation with chamfered corners of claim 23, wherein the wet etching uses a solution of HF/EG.

* * * * *